(12) United States Patent  
Tsai et al.

(10) Patent No.: US 8,710,739 B2
(45) Date of Patent: Apr. 29, 2014

(54) FLEXIBLE ORGANIC LIGHT EMITTING DEVICE AND MANUFACTURING METHOD THEREOF

(75) Inventors: Chih-Hung Tsai, Changhua County (TW); Ting-Yi Cho, New Taipei (TW); Chun-Jan Wang, Changhua County (TW); Chun-Hsiang Fang, Yilan County (TW)

(73) Assignee: Au Optronics Corporation, Hsinchu (TW)

( * ) Notice: Subject to any disclaimer, the term of this patent is extended or adjusted under 35 U.S.C. 154(b) by 23 days.

(21) Appl. No.: 13/352,344

(22) Filed: Jan. 18, 2012

(65) Prior Publication Data

US 2013/0099658 A1   Apr. 25, 2013

(30) Foreign Application Priority Data

Oct. 21, 2011   (TW) .............................. 100138264 A

(51) Int. Cl.
*H05B 33/14* (2006.01)
*H01J 9/00* (2006.01)

(52) U.S. Cl.
USPC .............. 313/512; 313/504; 313/506; 445/24

(58) Field of Classification Search
USPC ................................ 313/495–512; 445/24–25
See application file for complete search history.

(56) References Cited

U.S. PATENT DOCUMENTS

| | | | |
|---|---|---|---|
| 6,835,950 B2 | 12/2004 | Brown et al. | |
| 6,998,648 B2 | 2/2006 | Silvernail | |
| 7,732,262 B2 | 6/2010 | Imai et al. | |
| 7,838,328 B2 | 11/2010 | Isa | |
| 7,897,482 B2 | 3/2011 | Toriumi | |
| 7,928,510 B2 | 4/2011 | Watanabe | |
| 2003/0057422 A1* | 3/2003 | Yamazaki et al. | 257/79 |
| 2007/0228382 A1* | 10/2007 | Yamazaki et al. | 257/72 |
| 2009/0195152 A1* | 8/2009 | Sawano | 313/504 |
| 2010/0271354 A1 | 10/2010 | Yamashita et al. | |

FOREIGN PATENT DOCUMENTS

TW   I335041   12/2010
TW   I337046   2/2011

* cited by examiner

*Primary Examiner* — Anh Mai
*Assistant Examiner* — Elmito Breval
(74) *Attorney, Agent, or Firm* — Jianq Chyun IP Office

(57) ABSTRACT

A flexible organic light emitting device includes a flexible substrate, an organic light emitting unit and a covering substrate. The organic light emitting unit includes a first electrode layer, a second electrode layer opposing the first electrode, and a light emitting layer, which is disposed between the first and second electrode layers. The covering substrate includes a base film, an insulation layer and an adhesion layer. An inner surface of the base film is facing an inner surface of the flexible substrate, and space is formed there-between. The insulation layer is disposed on the inner surface of the base film, and an adhesive force between the insulation layer and the organic light emitting unit is less than 0.1 N/cm. The adhesion layer is disposed between the insulation layer and the inner surface of the base film, covers the insulation layer and the organic light emitting unit, and fills the space.

17 Claims, 5 Drawing Sheets

FLEXIBLE ORGANIC LIGHT EMITTING DEVICE AND MANUFACTURING METHOD THEREOF

CROSS-REFERENCE TO RELATED APPLICATION

This application claims the priority benefit of Taiwan application serial no. 100138264, filed on Oct. 21, 2011. The entirety of the above-mentioned patent application is hereby incorporated by reference herein and made a part of this specification.

BACKGROUND OF THE DISCLOSURE

1. Field of the Disclosure

This document relates to a light emitting device and a manufacturing method thereof, more particularly to a flexible organic light emitting device and a manufacturing method thereof.

2. Description of the Related Art

An organic light emitting device has the desirable qualities of light, compact, self-luminescent, low power consumption, back light-source free, and high reaction rate; therefore, it has been viewed as a dominant flat display device in the future. Moreover, an organic light emitting device can be configured in an array structure on a thin and flexible substrate; hence, it is suitably applied in illumination. Accordingly, an organic light emitting device plays an important role in illumination apparatus.

To be able to broadly apply an organic light emitting device, a flexible organic light emitting device is developed. Generally speaking, during the fabrication process of a flexible organic device, a flexible substrate is first adhered or formed on a carrier substrate, the fabrication of the organic light emitting device is then conducted on the flexible substrate, followed by packing the organic light emitting device with a cover plate. However, during the separation of the flexible substrate and the carrier substrate, an inward compression stress is generated by the flexible substrate and the cover plate due to the different Young moduli of the flexible substrate and the cover plate. Moreover, an upward pulling stress is induced on the organic light emitting device by the cover plate. Consequently, peeling of a film layer in the organic light emitting device is resulted, and the flexible organic light-emitting device becomes damaged and inoperable.

SUMMARY OF THE DISCLOSURE

In one aspect, a flexible light emitting device that includes a flexible substrate, an organic light emitting unit, and a covering substrate. The organic light emitting unit is disposed on the flexible substrate. The organic light emitting unit includes a first electrode layer, a second electrode layer, and an organic light emitting layer, wherein the first electrode and the second electrode layer opposing the first electrode layer, and the organic light emitting layer is disposed between the first electrode layer and the second electrode layer. The covering substrate includes a base film, an insulation layer, and an adhesion layer. An inner surface of the base film faces an inner surface of the flexible substrate, and a space is formed between the base film and the flexible substrate. The insulation layer is disposed on the inner surface of the base film, wherein the adhesive peeling force between the insulation layer and the organic light emitting unit is substantially less than 0.1 N/cm. The adhesion layer is disposed between the insulation layer and the inner surface of the base film, and the adhesion layer covers the insulation layer and the light emitting unit, and fills the space.

In another aspect, a manufacturing method of a flexible organic light emitting device. A flexible substrate is provided. An organic light emitting unit is formed on the flexible substrate, wherein the organic light emitting unit includes a first electrode layer, a second electrode layer, and an organic light emitting layer. The first electrode layer and the second electrode layer opposing the first electrode layer, and the organic light emitting layer is disposed between the first electrode layer and the second electrode layer. A covering substrate is provided on the flexible substrate. The method of providing the covering substrate includes providing a base film, wherein an inner surface of the base film faces an inner surface of the flexible substrate, and a space is formed between the base film and the flexible substrate. An insulation layer is disposed on the inner surface of the base film, and the adhesive peeling force between the insulation layer and the organic light emitting unit is substantially less than 0.1 N/cm. An adhesion layer is disposed between the insulation layer and an inner surface of the base film, and the adhesion layer covers the insulation layer and the organic light emitting unit, and fills the space.

According to a flexible organic light emitting device and a manufacturing method of a flexible organic light emitting device of the disclosure, the peeling of the film layer in the organic light emitting unit is prevented because the adhesive peeling force between the insulation layer and the organic light emit unit is substantially less than 0.1 N/cm. In one exemplary embodiment, since the adhesive peeling force between the insulation layer and the organic light emitting unit is substantially less than 0.1 N/cm and is substantially less than the adhesive peeling force between the second electrode layer and the organic light emitting layer, peeling of the second electrode layer at the interface between the second electrode layer and the organic light emitting layer is thereby prevented. Accordingly, the flexible organic light emitting device of the disclosure provides a better yield and device characteristics.

BRIEF DESCRIPTION OF THE DRAWINGS

The accompanying drawings, which are included to provide a further understanding of the disclosure and are incorporated on and constitute a part of this specification, illustrate embodiments of the invention and together with the description serve to explain the principles of the invention. In the drawings.

DETAILED DESCRIPTION OF DISCLOSED EMBODIMENTS

Figure 1A:
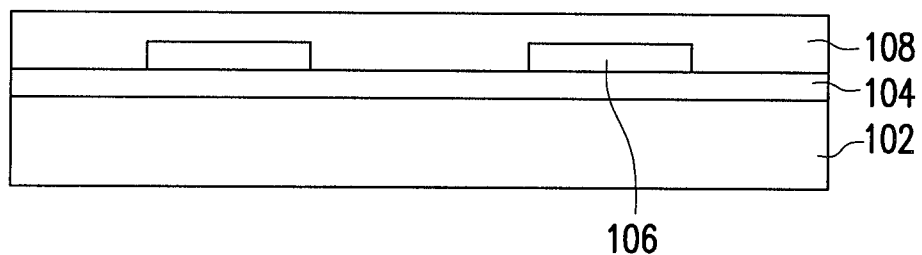
FIGS. 1A to 1F are schematic diagrams showing the steps for fabricating a flexible organic light-emitting device in a cross-sectional view according to an exemplary embodiment.

Reference will now be made in detail embodiments of the invention examples of which are illustrated in the accompanying drawings.

FIGS. 1A to 1F are schematic diagrams showing the steps for fabricating a flexible organic light-emitting device in a cross-sectional view according to an exemplary embodiment.

The disclosure herein refers to certain illustrated embodiments exemplified with two organic light-emitting units, it is to be understood that these embodiments are presented by way of example and not by way of limitation. For example, it is understood by a person of ordinary skill practicing this invention that the light emitting device may include one organic light emitting unit or a plurality of organic light emitting units. In this exemplary embodiment, a flexible substrate 104 is first provided. The flexible substrate 104 is provided on a carrier substrate 102, for example. Also, in this exemplary embodiment, the carrier substrate 102 is a highly rigid substrate, such as a glass substrate, a rigid plastic substrate, a metal substrate, a wafer, a ceramic substrate, etc. The flexible substrate 104 is, for example, an organic substrate, such as a polyimide substrate, a polycarbonate substrate, a polyethylene terephthalante (PET) substrate, a poly(ethylene 2,6-napthalate) (PEN) substrate, a polypropylene substrate, a polyethylene substrate, a polystyrene substrate, other appropriate substrates, or a substrate formed with the above polymer derivates, or a thin metal or alloy substrate. The flexible substrate 104, for example, is formed by a coating process on the carrier substrate 102, or by adhesion or other methods on the carrier substrate 102. In an exemplary embodiment, a device layer 106 is further formed on the flexible substrate 104, and a dielectric layer 108 having an opening (not shown) is formed on the device layer 106. In this invention, the device layer 106 is, for example, an active device layer, and the dielectric layer 108 is, for example, an insulation layer. However, it is to be understood that the examples above are presented by way of example and not by way of limitation. In this exemplary embodiment, the device layer 106 includes, for example, thin film transistors, which may be a top gate type or a bottom gate type. The material of the semiconductor layer (not shown) in the transistor includes, an amorphous semiconductor material, a polycrystalline semiconductor material, a single crystal semiconductor material, a micro-crystal semiconductor material, a transparent oxide semiconductor material, an organic semiconductor material, or other appropriate materials, or a combination of at least two of the above materials.

Figure 1B:
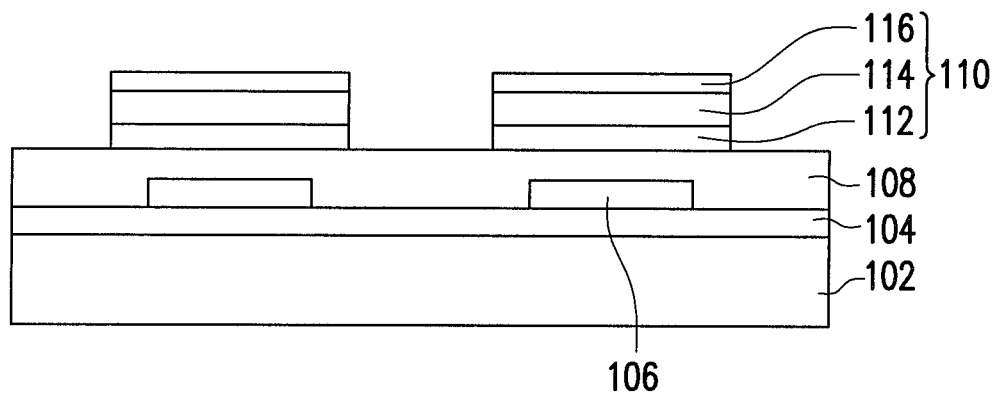

Referring to FIG. 1B, organic light emitting units 110 are formed on the flexible substrate 104. In an exemplary embodiment, the organic light emitting units 110 are formed on the dielectric layer 108, for example, wherein the organic light emitting units 110 are electrically connected to the device layer 106 through the opening (not shown) of the dielectric layer 108. In an exemplary embodiment, each organic light emitting unit 110 includes, for example, a first electrode layer 112, an organic light emitting layer 114, and a second electrode layer 116 stacked on the flexible substrate 104. Alternatively speaking, the organic light emitting layer 114 is formed between the first electrode layer 112 and the second electrode layer 116. The organic light emitting unit 110 is formed according to the following process steps, for example, the first electrode layer 112 is formed on the dielectric layer 108, wherein the first electrode layer 112 and the device layer 106 are electrically connected. Then, the organic light emitting layer 114 is formed on the first electrode layer 112. Thereafter, the second electrode layer 116 is formed on the organic light emitting layer 114. In other embodiment, the second electrode layer 116 is formed on the dielectric layer 108 first, wherein the second electrode layer 116 and the device layer 106 are electrically connected. Then, the organic light emitting layer 114 is formed on the second electrode layer 116. Thereafter, the first electrode layer 112 is formed on the organic light emitting layer 114.

In an exemplary embodiment, the first electrode layer 112 is an anode, for example, wherein the material of the first electrode layer 112 includes a transparent conductive material or a nontransparent conductive material. Further, the first electrode layer 112 may be a single layer structure or a multi-layer structure. The transparent conductive layer includes, but not limited to, metal oxide, such as, indium tin oxide, indium zinc oxide, aluminum tin oxide, aluminum zinc oxide, indium gallium zinc oxide, other appropriate oxide materials (such as oxide zinc), or a stacked layer with at least two of the above oxide materials. The nontransparent conductive material includes metal, such as silver, aluminum, molybdenum, copper, or titanium, or other appropriate metals. The first electrode layer 112 is formed by, for example, evaporation, coating, deposition, or other appropriate methods. The organic light-emitting layer 114 may include a red organic light-emitting pattern, a green organic light-emitting pattern, a blue organic light-emitting pattern, or other color light-emitting pattern, or a combination of the above light-emitting patterns. The organic light emitting layer 114 is formed by, for example, evaporation, coating, deposition, or other appropriate methods. The second electrode layer 116 is, for example, a cathode. The material and the fabrication method of the second electrode layer 116 are similar to those of the first electrode layer 112, and thereby will not be further reiterated herein. It is to be understood that the first electrode layer 112 and the second electrode layer 116 designed to be an anode or a cathode is presented by way of example herein and not by way of limitation. Variations of the designs of the first electrode layer 112 and the second electrode layer 116 fall within the spirit and scope of the invention.

Figure 1C:
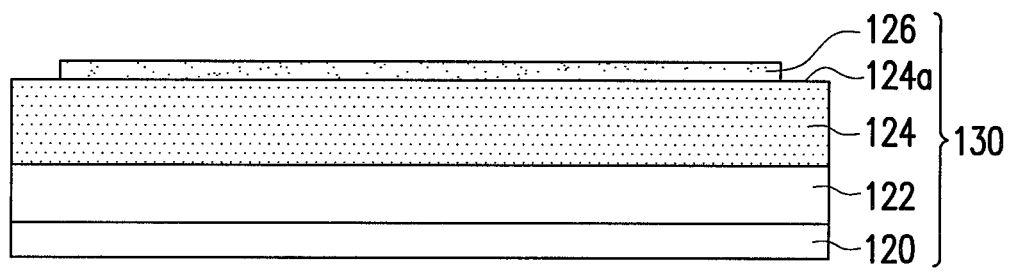

Thereafter, a covering substrate 130 is provided as shown in FIG. 1C. In an exemplary embodiment, the covering substrate 130 is fabricated by, for example, providing a base film 120 and forming an adhesion layer 124 on the base film 120. In this exemplary embodiment, the base film 120 includes, polyethylene terephthalante (PET), and the material of the adhesion layer 124 includes pressure sensitive adhesive (PSA), light curable adhesive, thermal curable adhesive type of encapsulation adhesive material. Further, the adhesion layer 124 is formed by coating, for example.

Thereafter, an insulation layer (or namely dielectric layer) 126 is formed on the adhesion layer 124. The insulation layer 126 exposes the periphery 124a of the adhesion layer 124. In this exemplary embodiment, the insulation layer 126 is formed by, for example, forming an insulation material layer (not shown) on the adhesion layer 124, wherein the insulation material layer covers the adhesion layer 124, followed by patterning the insulation material layer to form the insulation layer 126 that exposes the periphery 124a of the adhesion layer 124. The insulation layer 126 may include an organic material or an inorganic material, wherein an organic material may include NPB (N, N'-diphenyl-N, N'-bis(1-naphthyl)-(1, 1'-biphenyl)-4, 4'-diamine) or other suitable materials, and an inorganic material may include, for example, aluminum oxide, titanium oxide, type of metal oxides or lithium fluoride, silicon nitride, silicon oxide, metal, or alloy. The insulation layer 126 is formed by, for example, evaporation, coating, deposition, or other appropriate methods. The thickness of the insulation layer 126 is substantially between 0.01 μm and 100 μm. In one exemplary embodiment, the thickness of the insulation layer 126 is about 0.1 μm. In an exemplary embodiment, to ensure sufficient protection for the covering substrate 130, a barrier layer 122 may optionally form on the base film 120 of the covering substrate 130. The material of the barrier layer 122 includes silicon oxide ($SiO_x$), and the barrier layer 122 may form by sputtering. The exemplary embodiments refers herein include a barrier layer; however, it is to be understood that a barrier layer 122 may be omitted if the protection of the covering substrate 130 is precluded.

Figure 1D:
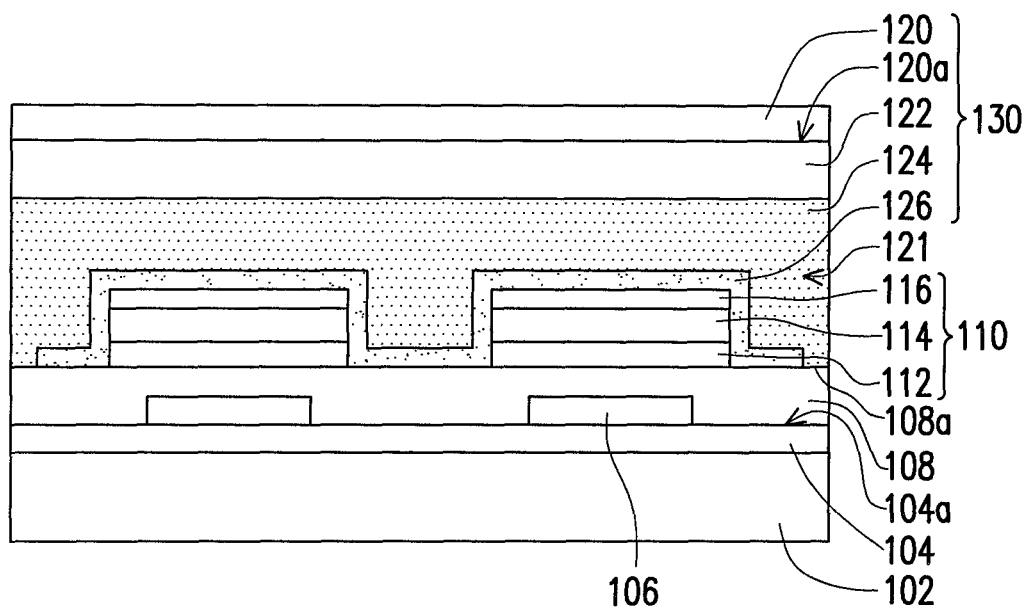

Referring to FIG. 1D, the covering substrate 130 is provided on the flexible substrate 104, for example by providing the base film 120, wherein the inner surface 120a of the base film 120 faces the inner surface 104a of the flexible substrate 104, and a space 121 is formed between the base film 120 and the flexible substrate 104. The insulation layer 126 is disposed on the inner surface 120a of the base film 120, wherein the adhesive peeling force between the insulation layer 126 and the organic light emitting unit 110 is substantially less than 0.1 N/cm. The adhesion layer 124 is disposed between the insulation layer 126 and the inner surface 120a of the base film 120, and the adhesion layer 124 covers the insulation layer 126 and the organic light emitting unit 110 and fills the space 121. In this exemplary embodiment, the covering substrate 130 further includes a barrier layer 122, which is presented by way of example and not by way of limitation. The space 121 is formed between the inner surface of the barrier layer 122 and the inner surface of the flexible substrate 104. The insulation layer 126 is, for example disposed on the inner surface of the barrier layer 122.

In this exemplary embodiment, the flexible substrate 104 and the covering substrate 130 are bonded together via the adhesion layer 124. Consequently, the insulation layer 126 is disposed between the organic light emitting unit 110 and the adhesion layer 124, and the insulation layer 126 and the organic light emitting units 110 are covered by the adhesion layer 124. Further, the adhesive peeling force between the insulation layer 126 and the organic light emitting unit 110 is substantially less than 0.1 N/cm. In an exemplary embodiment, if the flexible substrate 104 and the covering substrate 130 are bonded under vacuum, for example, the resulting bonded structure is subsequently transferred to an environment in which vacuum is drawn, and the flexible substrate 104 and the covering substrate 130 are tightly bonded due to atmospheric pressure. In this exemplary embodiment, since the periphery 124a of the adhesion layer 124 is exposed by the insulation layer 126, the insulation layer 126 correspondingly exposes the periphery 108a of the dielectric layer 108. In this exemplary embodiment, the insulation layer 126, for example, covers a plurality of the organic light emitting units 110 continuously and further covers the sides of the organic light emitting units 110. Although the covering substrate 130 in this exemplary embodiment is formed according the method as shown in FIG. 1C and the covering substrate 130 is provided on the flexible substrate 104 through, for example, bonding, it is to be understood that the fabrication method of covering substrate 130 and the disposition method of the covering substrate 130 on the flexible substrate 104 above are presented by way of example and not by way of limitation.

In this exemplary embodiment, the insulation layer 126 is disposed on the organic light emitting units 110 for example, through the bonding of the flexible substrate 104 and the covering substrate 130, and the adhesive peeling force between the insulation layer 126 and the organic light emitting unit 110 is substantially less than 0.1 N/cm. For example, the adhesive peeling force between the insulation layer 126 and the second electrode layer 116 is less than 0.1 N/cm. Moreover, in this exemplary embodiment, comparing to the second electrode layer 116 that is formed on the organic light emitting layer 114 via an evaporation method, the insulation layer 126 is formed on the inner surface of the base film 120 of the covering substrate 130, and is disposed on the second electrode layer 116 through the bonding of the flexible substrate 104 and the covering substrate 130. The surface of the insulation layer 126 is in contact with the surface of the organic light emitting unit 110, but no bonding force is generated between the surface of the insulation layer 126 and the surface of the organic light emitting units 110. Hence, the adhesive peeling force between the insulation layer 126 and the organic light emitting unit 110, for example, is substantially less than the adhesive peeling force between the second electrode layer 116 and the organic light emitting layer 114. In other words, the adhesive peeling force between the insulation layer 126 and the adhesion layer 124 is maybe substantially greater than the adhesive peeling force between the insulation layer 126 and the organic light emitting unit 110 and the adhesive peeling force between the insulation layer 126 and adhesion layer 124 is maybe substantially greater than the adhesive peeling force between the insulation layer 126 and the flexible substrate 104.

Figure 1E:
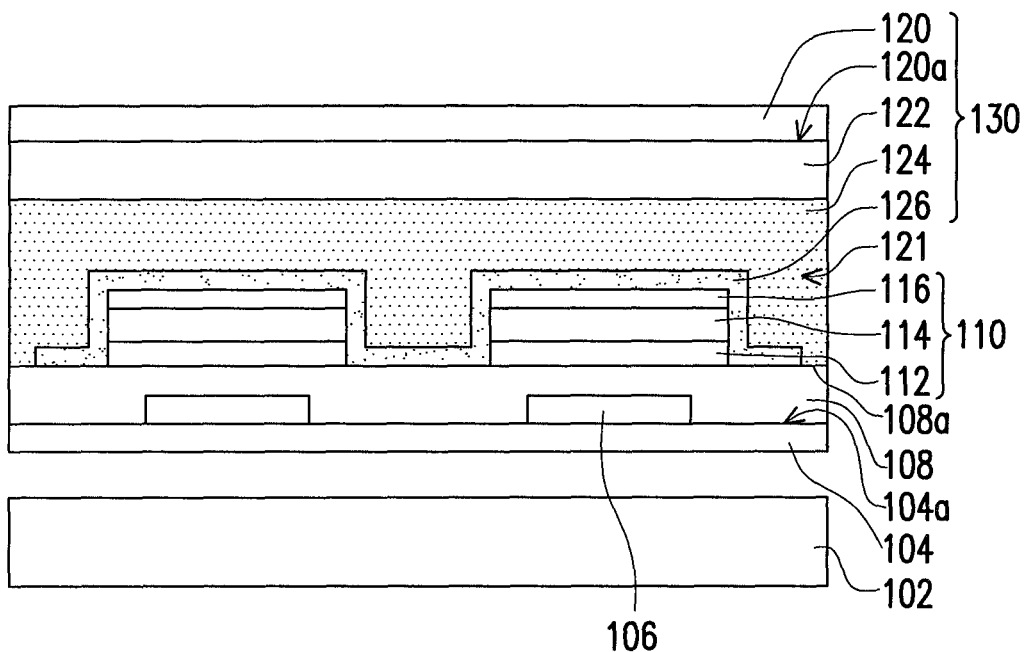
Figure 1F:
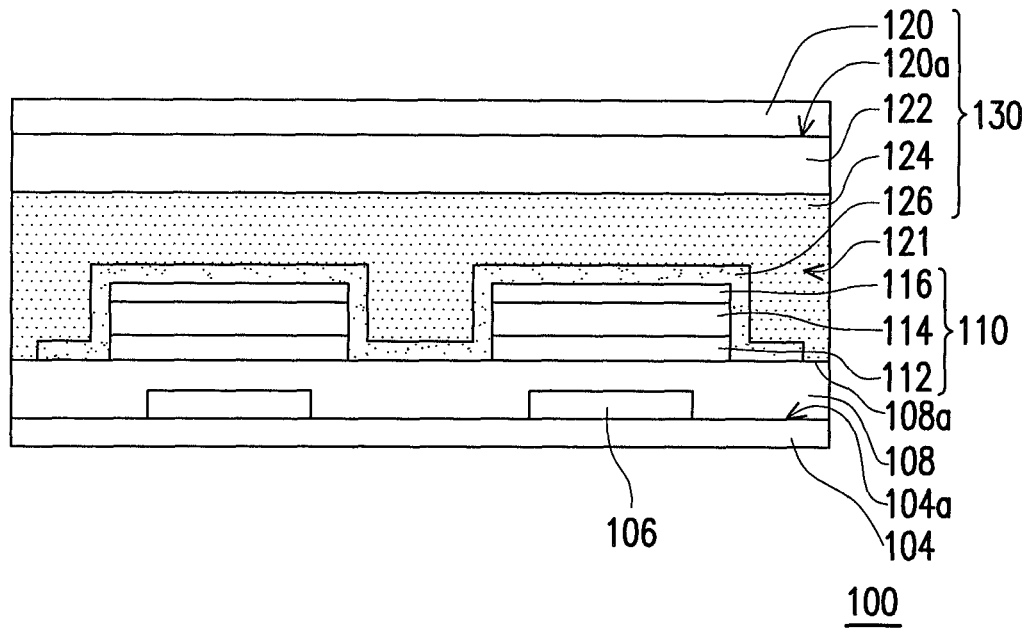

Referring to both FIGS. 1E and 1F, in this exemplary embodiment, after the covering substrate 130 is provided on the flexible substrate 104, the flexible substrate 104 and the carrier substrate 102 are de-bonded to form a flexible organic light emitting device 100, as shown in FIG. 1F. In this exemplary embodiment, the method of debonding the flexible substrate 104 and the carrier substrate 102 includes, thread peeling, prying, cutting, or other appropriate methods. It is worthy to note that since the adhesive peeling force between the insulation layer 126 and the organic light emitting unit 110 is substantially less than 0.1 N/cm, and the insulation layer 126 is disposed between the organic light emitting unit 110 and the adhesion layer 124, the peeling between the second electrode layer 116 and the organic light emitting layer 114 due to the stress generated from the contact between the adhesion layer 124 and the organic light emitting unit 110 during the separation of the flexible substrate 104 and the carrier substrate 102 is obviated. Accordingly, the flexible organic light emitting device 100 of the exemplary embodiments has a better yield and device characteristics. In a comparative example, the insulation layer 126 is first formed on the flexible substrate 104 with the organic light emitting unit 110 formed thereon and is not formed on the covering substrate 130. Hence, during the separation of the flexible substrate 104 and the carrier substrate 102, due to the bonding force generated from the bonding between the insulation layer 126 and the film layers of the organic light emitting unit 110, the adhesive peeling force between the insulation layer 126 and the organic light emitting unit 110 is far greater than the adhesive peeling force between adjacent thin film layers in the organic light emitting unit 110 or any additional pulling force. Consequently, the organic light emitting units 110 become damaged, leading to abnormal light emission and low yield.

Referring to FIG. 1F, in this exemplary embodiment, the flexible organic light emitting device 100 includes the flexible substrate 104, the organic light emitting units 110, and the covering substrate 130. Each organic light emitting unit 110, which is disposed on the flexible substrate 104, includes the first electrode layer 112, the second electrode layer 116, and the organic light emitting layer 114. The first electrode layer 112 and the second electrode layer 116 opposing to the first electrode layer 112. The organic light emitting layer 114 is disposed between the first electrode layer 112 and the second electrode layer 116. The covering substrate 130 includes the base film 120, the insulation layer 126, and the adhesion layer 124. The inner surface 120a of the base film 120 faces the inner surface 104a of the flexible substrate 104, and a space 121 is formed between the base film 120 and the flexible substrate 104. The insulation layer 126 is disposed on the inner surface 120a of the base film 120, wherein the adhesive peeling force between the insulation layer 126 and the organic light-emitting unit 110 is substantially less than 0.1 N/cm. Alternatively speaking, the insulation layer 126 is formed on the inner surface of the base film 120 of the covering substrate 130 and is not directly formed to cover the external surface of the organic light emitting units 110. The adhesion layer 124 is disposed between the insulation layer 126 and the inner surface 120a of the base film 120, covers the insulation layer 126 and the organic light emitting units 110, and fills the space 121 there-between. When the adhesion layer 124 is not completely cured and still has fluidity, the adhesion layer 124 follows the existing profiles of the organic light-emitting units 110 and fills the space 121 when the two substrates 104, 130 are pressure bonded together. If the insulation layer 126 is made of a flexible organic material, it also follows the profiles of the organic light emitting units 110. If the insulation layer 126 is constructed with an inorganic material, metal or an alloy, and it is not as flexible as an organic material, because it is thin, the insulation layer 126 also follows the profiles of the organic light emitting units 110. However, the insulation layer 126 may have cracks. In an exemplary embodiment, the covering substrate 130 may optionally include a barrier layer 122, for example. The barrier layer 122 is disposed on the inner surface 120a of the base film 120 and between the base film 120 and the adhesion layer 124, for example. The space 121 is formed between the barrier layer 122 and the flexible substrate 104. The insulation layer 126 is disposed on the inner surface of the barrier layer 122, for example.

Figure 2:
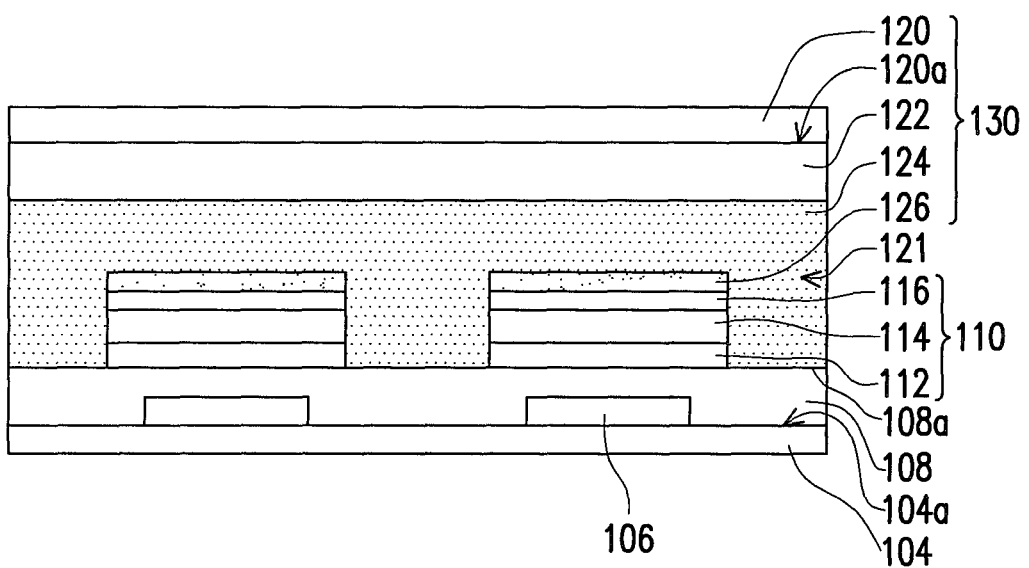
FIG. 2 is a schematic cross-sectional diagram of a flexible light-emitting device according to an exemplary embodiment.

It is worthy to note that, in the exemplary embodiment, the insulation layer 126 covers the plurality of the organic light emitting units 110 continuously and also covers the sides of the organic light emitting units 110. However, in another exemplary embodiment as shown in FIG. 2, in the flexible organic light emitting device 100a, preferred, the area of the insulation layer 126 in the top-view is substantially the same as the area of the second electrode layer 116 in the top-view and is disposed only above the second electrode layer 116 while the sides of the organic light emitting units 110 are exposed. Moreover, in another exemplary embodiment (not shown), the flexible organic light emitting device further includes a gap, for example, wherein the gap is formed between the organic light emitting units 110 and the insulation layer 126. Alternatively speaking, since the insulation layer 126 and the organic light emitting layer 110 are not actually in contact, the adhesive peeling force between the insulation layer 126 and the organic light emitting unit 110 is less than 0.1 N/cm. Additionally, although the above disclosure refers to certain illustrated embodiments exemplified with the organic light emitting units 110, the dielectric layer 108 and the device layer 106 having the above dispositions, it is to be understood that the organic light emitting units 110 and the device layer 106 may configured in other dispositions.

In this exemplary embodiment, the adhesive peeling force between the insulation layer 126 and the organic light emitting unit 110 is less than 0.1 N/cm. More specifically, since the insulation layer 126 is disposed on the light emitting units 110 through the bonding of the flexible substrate 104 and the base film 120. The surface of the insulation layer 126 is in contact with the surface of the organic light emitting units 110, and no bonding force is generated between the surface of the insulation layer 126 and the surface of the light emitting units 110. Accordingly, the adhesive peeling force between the insulation layer 126 and the organic light emitting unit 110 is substantially less than the adhesive peeling force between the second electrode layer 116 and the organic light emitting layer 114, and is less than 0.1 N/cm. In other words, the adhesive peeling force between the insulation layer 126 and the adhesion layer 124 is maybe substantially greater than the adhesive peeling force between the insulation layer 126 and the organic light emitting unit 110. Accordingly, during the separation of the flexible substrate 104 and the carrier substrate 102, the peeling of the second electrode layer 116 at the interface of the second electrode layer 116 and the organic light emitting layer 114 is thereby prevented because the adhesive peeling force between the second electrode layer 116 and the organic light emitting layer 114 is substantially greater than the adhesive peeling force between the insulation layer 126 and the second electrode layer 116. Therefore, the flexible organic light emitting device 100 of the exemplary embodiments has a better yield and device characteristics.

Figure 3A:
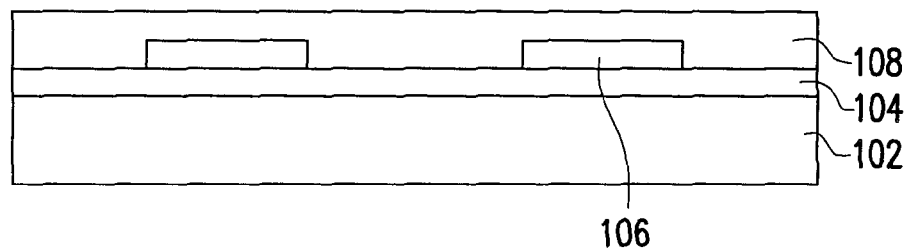
FIGS. 3A to 3E are schematic diagrams showing the steps for fabricating a flexible organic light-emitting device in a cross-sectional view according to an exemplary embodiment.

FIGS. 3A to 3E are schematic diagrams showing the steps for fabricating a flexible organic light-emitting device in a cross-sectional view according to an exemplary embodiment of the invention. Referring to FIG. 3A, a flexible substrate 104 is first provided. Further, a carrier substrate 102 is provided, and a flexible substrate 104, a device layer 106, and a dielectric layer 108 are sequentially formed on the carrier substrate 102. The materials and the fabrication methods of the carrier substrate 102, the flexible substrate 104, the device layer 106 and the dielectric layer 108 may refer to the previous exemplary embodiments and will not be further reiterated. The following disclosure is going to focus on the differences between the current exemplary and the previous exemplary embodiments.

Figure 3B:
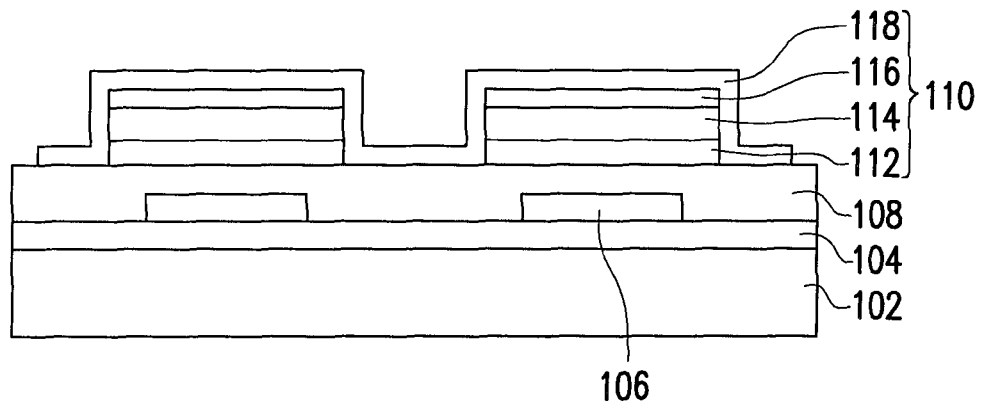

Referring to FIG. 3B, an organic light emitting units 110 are formed on the flexible substrate 104. In this exemplary embodiment, the organic light emitting unit 110 includes, for example, a first electrode layer 112, an organic light emitting layer 114, a second electrode layer 116, and a thin film encapsulation layer 118. The method of forming the organic light emitting units 110 includes forming the first electrode layer 112, the organic light emitting layer 114, the second electrode layer 116, and the thin film encapsulation layer 118, and the first electrode layer 112 is electrically connected to the device layer 106, for example. In this exemplary embodiment, the thin film encapsulation layer 118 is formed with a material that includes, but not limited to, aluminum oxide, and the thin film package layer 118 is formed by, for example, evaporation, sputtering, or other appropriate methods.

Figure 3C:
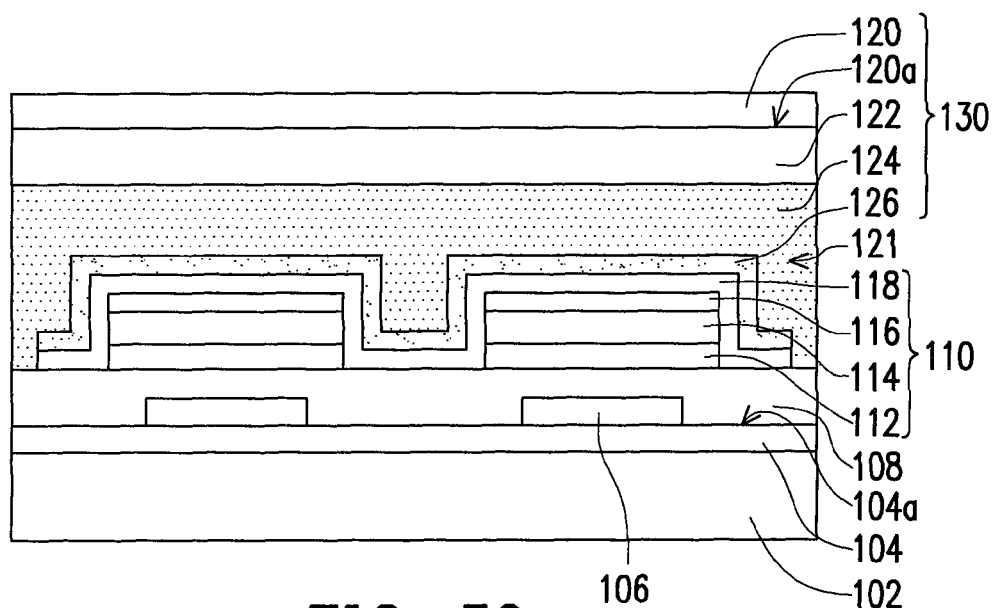

Referring to FIG. 3C, a covering substrate 130 is provided on the flexible substrate 104 by the following process steps, for example. A base film 120 is provided, wherein the inner surface 120a of the base film 120 faces the inner surface 104a of the flexible substrate 104, and a space 121 is formed between the base film 120 and the flexible substrate 104. An insulation layer 126 is disposed on the inner surface 120a of the base film 120, wherein the adhesive peeling force between the insulation layer 126 and the organic light emitting unit 110 is substantially less than 0.1 N/cm. An adhesion layer 124 is disposed between the insulation layer 126 and the inner surface 120a of the base film 120, wherein the adhesion layer 124 covers the insulation layer 126 and the organic light emitting units 110 and fills the space 121. In this exemplary embodiment, the covering substrate 130 may optionally include a barrier layer 122, for example. However, it is to be understood that an inclusion of a barrier layer is presented by way of example and not by way of limitation. Accordingly, the space 121 is formed between the barrier layer 122 and the flexible substrate 104, for example. The insulation layer 126 is disposed on the inner surface 120a of the base film 120, for example. In this exemplary embodiment, the insulation layer 126 is formed with an organic material or an inorganic material, wherein the organic material includes NPB (naphylhenyldiamine), for example, while the inorganic material includes, for example, aluminum oxide, titanium oxide, type of metal oxides or lithium fluoride, silicon nitride or silicon oxide. The insulation layer 126 is formed by evaporation, coating, deposition, or other appropriate methods, for example. The insulation layer 126 is about 0.10 μm to about 100 μm thick. In one exemplary embodiment, the insulation layer 126 is about 0.1 μm thick. In another exemplary embodiment (not shown), a patterned insulation material layer is disposed above the second electrode layer 116, exposing the sides of the light emitting units 110. Alternatively speaking, the area of the insulation layer 126 in the top-view can be substantially the same as the area of the second electrode layer 116 in the top-view and the insulation layer 126 is only correspondingly disposed on the second electrode layer 116.

Figure 3D:
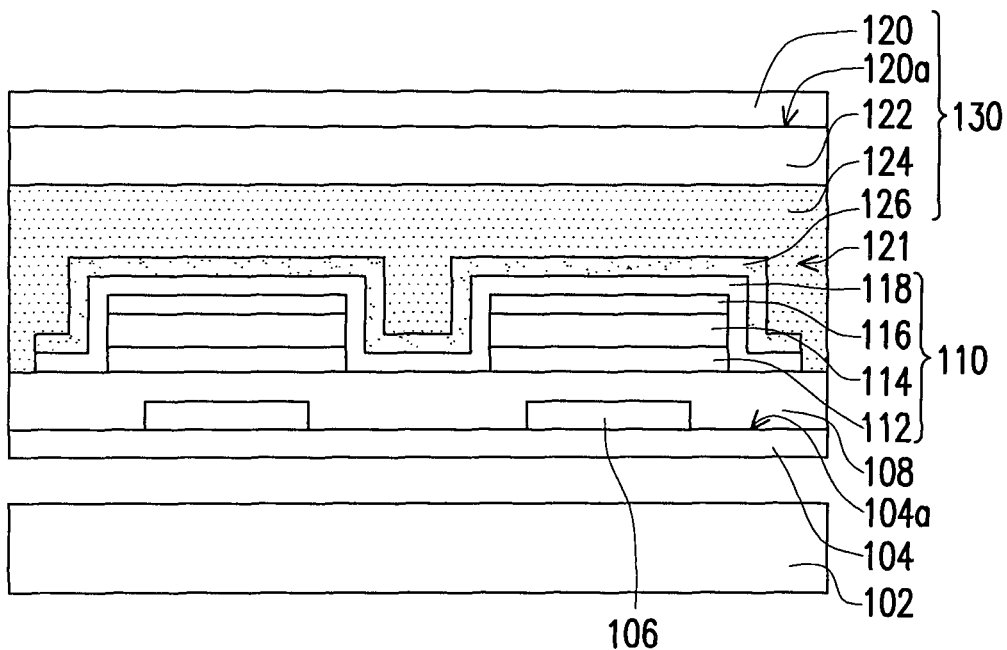
Figure 3E:
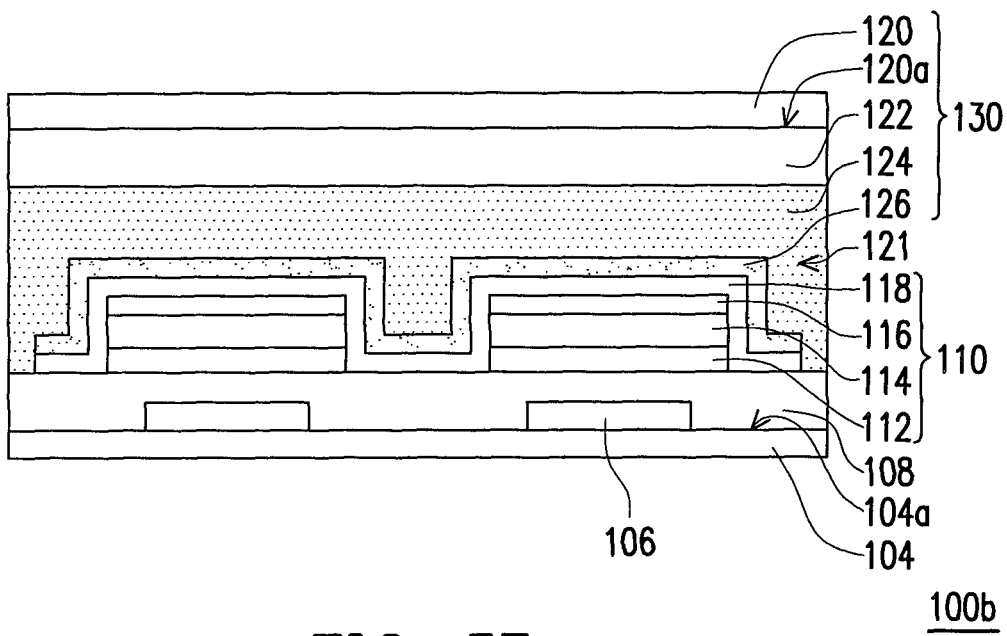

Referring to both FIGS. 3D and 3E, the flexible substrate 104 and the carrier substrate 102 are separated to form the flexible organic light emitting device 100b, as shown in FIG. 3E. In this exemplary embodiment, the flexible substrate 104 and the carrier substrate 102 are separated by, for example, thread peeling, prying, cutting, or other appropriate methods. It is worthy to note that, since the adhesive peeling force between the insulation layer 126 and the organic light emitting units 110 is substantially less than 0.1 N/cm, and the insulation layer 126 is disposed between the organic light emitting units 110 and the adhesion layer 124, stress generated due to the contact between the adhesion layer 124 and the light emitting units 110 leading to the peeling of the second electrode layer 116 and the organic light emitting layer 114 during the separation of the flexible substrate 104 and the carrier substrate 102 is obviated. Accordingly, the flexible light emitting device 100b of the invention has a better yield and device characteristics.

Referring to FIG. 3E, in this exemplary embodiment, the flexible organic light emitting device 110b includes the flexible substrate 104, the organic light emitting units 110 and the covering substrate 130. The organic light emitting units 110 are disposed on the flexible substrate 104, and each unit 110 includes the first electrode layer 112, the second electrode layer 116, and the organic light emitting layer 114. The first electrode layer 112 and the second electrode layer 116 opposing to the first electrode layer 112. The organic light emitting layer 114 is disposed between the first electrode layer 112 and the second electrode layer 116. The covering substrate 130 includes the base film 120, the insulation layer 126, and the adhesion layer 124. The inner surface 120a of the base film 120 faces the inner surface 104a of the flexible substrate 104, and a space 121 is formed between the base film 120 and the flexible substrate 104. The insulation layer 126 is disposed on the inner surface 120a of the base film 120, wherein the adhesive peeling force between the insulation layer 126 and the organic light emitting unit 110 is substantially less than 0.1 N/cm. The adhesion layer 124 is disposed between the insulation layer 126 and the inner surface 120a of the base film 120, and the adhesion layer 124 covers the insulation layer 126 and the organic light emitting units 110 and fills the space 121. Alternatively speaking, since the insulation layer 126 is disposed on the organic light emitting units 110 through the bonding of the flexible substrate 104 and the base film 120, the surface of the insulation layer 126 is in contact with the surface of the organic light emitting units 110, and there is no bonding force generated between the surface of the insulation layer 126 and the surface of the organic light emitting units 110. Hence, the adhesive peeling force between the insulation layer 126 and the organic light emitting unit 110 is substantially less than the adhesive peeling force between the second electrode layer 116 and the organic light emitting layer 114, and is less than 0.1 In other words, the adhesive peeling force between the insulation layer 126 and the adhesion layer 124 is maybe substantially greater than the adhesive peeling force between the insulation layer 126 and the organic light emitting unit 110. In this exemplary embodiment, the organic light emitting units 110 further includes the thin film encapsulation layer 118, preferred, the area of the insulation layer 126 in the top-view is substantially the same as the area of the thin film encapsulation layer 118 in the top-view, wherein the thin film encapsulation layer 118 is disposed between the insulation layer 126 and the second electrode layer 116, for example. Alternatively speaking, the adhesive peeling force between insulation layer 126 and the thin film encapsulation layer 118 is substantially less than 0.1 N/cm. In other words, the adhesive peeling force between the insulation layer 126 and adhesion layer 124 is maybe substantially greater than the adhesive peeling force between the insulation layer 126 and the thin film encapsulation layer 118. The covering substrate 130 may optionally include the barrier layer 122, for example. The barrier layer 122 is disposed on the inner surface 120a of the base film 120 and is disposed between the base film 120 and the adhesion layer 124, for example. The space 121 is formed between the barrier layer 122 and the flexible substrate 104, for example. The insulation layer 126 is disposed on the inner surface of the barrier layer 122, for example.

It is worthy to note that, in another exemplary embodiment (not shown), the flexible organic light emitting device further includes a gap formed between the organic light emitting units 110 and the insulation layer 126, for example. In other words, the insulation layer 126 and the organic light emitting units 110 are not actually in contact; hence, the adhesive peeling force between the insulation layer 126 and the organic light emitting unit 110 is less than 0.1 N/cm. Although the disclosure herein refers to certain illustrated embodiments exemplified with the organic light emitting units 110, the dielectric layer 108, and the device layer 106 having the above dispositions, it is to be understood that these embodiments are presented by way of example and not by way of limitation. For example, it is understood by a person of ordinary skill practicing this invention that the organic light emitting units 110 and the device layer 106 may have other configurations.

In this exemplary embodiment, the adhesive peeling force between the insulation layer 126 and the organic light emitting unit 110 is substantially less than 0.1 N/cm. In other words, the adhesive peeling force between the insulation layer 126 and the thin film encapsulation layer 118 is substantially less than 0.1 N/cm. Accordingly, during the separation of the flexible substrate 104 and the carrier substrate 102, since the adhesive peeling force between adjacent thin film layers in the organic light emitting unit 110 is substantially greater than the adhesive peeling force between the insulation layer 126 and the thin film encapsulation layer 118, the film layers, such as the second electrode layer 116, are prevented from peeling from the interface. Accordingly, the flexible organic light emitting device 100b of the exemplary embodiments has a better yield and device characteristics.

According to the flexible organic light emitting device and the fabrication method thereof of the exemplary embodiments of the invention, the insulation layer is initially formed on the base film of the covering substrate, and not formed on the organic light emitting units. Hence, the adhesive peeling force between the insulation layer and the organic light emitting unit is substantially less than 0.1 N/cm. Accordingly, during the separation of the flexible substrate and the carrier substrate, the peeling of the film layers, such as the second electrode layer, due to the pulling stress generated during the separation of the flexible substrate and the carrier substrate is prevented, since the adhesive peeling force between the insulation layer and the organic light emitting unit is substantially less than that between adjacent film layers in the organic light emitting unit.

In an exemplary embodiment, the flexible substrate is fabricated with the organic light emitting units, and the covering substrate is formed by fabricating an adhesion layer and an insulation layer on a base film, followed by bonding the flexible substrate and the covering substrate together. Consequently, the insulation layer is disposed on the light emitting units. Accordingly, the adhesive peeling force between the insulation layer and the organic light emitting unit is assured to be substantially less than 0.1 N/cm and to be less than the adhesive peeling force between adjacent film layers in the organic light emitting units. Since the weakest adhesive peeling force does not exist at the interface between adjacent film layers in the organic light emitting unit, but exists between the insulation layer and the light emitting unit, a desirable adhesion is maintained between the adjacent film layers in the organic light emitting unit even a stress is generated by the flexible substrate and the barrier layer or an upward pulling stress is generated by the barrier on the organic light emitting unit. Accordingly, the flexible organic light emitting device of the invention has a better yield and device characteristics.

The foregoing embodiments and advantages are merely exemplary and are not to be construed as limiting the present disclosure. The present teaching can be readily applied to other types of apparatuses. The description of the foregoing embodiments is intended to be illustrative, and not to limit the scope of the claims. Many alternatives, modifications, and variations will be apparent to those skilled in the art.

What is claimed is:

1. A flexible organic light emitting device, comprising:
   a flexible substrate;
   an organic light emitting unit, disposed on the flexible substrate, the organic light emitting unit comprising:
      a first electrode layer and a second electrode layer opposing the first electrode layer; and
      an organic light emitting layer, disposed between the first electrode layer and the second electrode layer;
   a covering substrate having a base film, an adhesion layer and an insulation layer, wherein the adhesion layer is formed on an inner surface of the base film, the insulation layer is formed on the adhesion layer, and the adhesion layer is disposed between the insulation layer and the inner surface of the base film;
   wherein the covering substrate is disposed on the flexible substrate, so that the inner surface of the base film faces an inner surface of the flexible substrate, the base film and the flexible substrate form a space therebetween, and the insulation layer is disposed between the base film and the organic light emitting unit;
   wherein an adhesive peeling force between the insulation layer and the organic light emitting unit is substantially less 0.1 N/cm, and the adhesion layer covers the insulation layer and the organic light emitting unit and fills the space.

2. The flexible organic light emitting device of claim 1, wherein an adhesive peeling force between the insulation layer and the second electrode layer is substantially less than 0.1 N/cm.

3. The flexible organic light emitting device of claim 1, wherein the adhesive peeling force between the insulation layer and the organic light emitting unit is substantially less than an adhesive peeling force between the second electrode layer and the organic light emitting layer.

4. The flexible organic light emitting device of claim 1, wherein the light emitting unit further comprises an encapsulation layer, the encapsulation layer disposed between the second electrode layer and the insulation layer, wherein an adhesive peeling force between the encapsulation layer and the second electrode layer is substantially greater than an adhesive peeling force between the insulation layer and the encapsulation layer.

5. The flexible organic light emitting device of claim 4, wherein the adhesive peeling force between the insulation layer and the encapsulation layer is substantially less than 0.1 N/cm.

6. The flexible organic light emitting device of claim 1, wherein the thickness of the insulation layer is between about 0.01 μm to about 100 μm.

7. The flexible organic light emitting device of claim 1, wherein the insulation layer is disposed on the organic light emitting unit and covers sides of the organic light emitting unit.

8. The flexible organic light emitting device of claim 1, wherein the organic light emitting unit and the insulation layer further comprises a gap therebetween.

9. The flexible organic light emitting device of claim 1, wherein no bonding force is generated between the insulation layer and the organic light emitting unit.

10. A manufacturing method of a flexible organic light emitting device, the manufacturing method comprising:
    providing a flexible substrate;
    forming an organic light emitting unit on the flexible substrate, wherein the organic light emitting unit comprising:
       a first electrode layer and a second electrode layer; and
       an organic light emitting layer disposed between the first electrode layer and the second electrode layer; and
    providing a covering substrate, the covering substrate comprising a base film an adhesion layer and an insulation layer, wherein the adhesion layer is formed on an inner surface of the base film, the insulation layer is formed on the adhesion layer, and the adhesion layer is disposed between the insulation layer and the inner surface of the base film:
    disposing the covering substrate on the flexible substrate, so that the inner surface of the base film faces an inner surface of the flexible substrate, the base film and the flexible substrate form a space therebetween, and the insulation layer is disposed between the base film and the organic light emitting unit,
    wherein an adhesive peeling force between the insulation layer and the organic light emitting unit is substantially less 0.1 N/cm,
    and the adhesion layer covers the insulation layer and the organic light emitting unit and fills the space.

11. The manufacturing method of claim 10 further comprising forming the flexible substrate on a carrier substrate and separating the flexible substrate and the carrier substrate after the step of providing the covering substrate.

12. The manufacturing method of claim 10, wherein an adhesive peeling force between the insulation layer and the second electrode layer is substantially less than 0.1 N/cm.

13. The manufacturing method of claim 10, wherein the adhesive peeling force between the insulation layer and the organic light emitting unit is substantially less than an adhesive peeling force between the second electrode layer and the organic light emitting layer.

14. The manufacturing method of claim 10 further comprising forming an encapsulation layer between the second electrode layer and the insulation layer.

15. The manufacturing method of claim 14, wherein an adhesive peeling force between the insulation layer and the encapsulation layer is substantially less than 0.1 N/cm.

16. The manufacturing method of claim 10, wherein the insulation layer and the organic light emitting unit further comprises a gap therebetween.

17. The manufacturing method of claim 10, wherein no bonding force is generated between the insulation layer and the organic light emitting unit.

* * * * *